United States Patent
Olarig et al.

(10) Patent No.: US 8,041,468 B2
(45) Date of Patent: Oct. 18, 2011

(54) METHOD FOR DYNAMICALLY COOLING WHEN DETECTING RAID CONTROLLER WITH BATTERY PRESENT IN COMPUTER SYSTEM

(75) Inventors: Sompong Paul Olarig, Pleasanton, CA (US); Ralph Bestavros, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 1201 days.

(21) Appl. No.: 11/376,881

(22) Filed: Mar. 16, 2006

(65) Prior Publication Data

US 2007/0214820 A1    Sep. 20, 2007

(51) Int. Cl.
*G05D 23/00*    (2006.01)
*G06F 1/00*    (2006.01)

(52) U.S. Cl. ........ 700/299; 700/300; 713/320; 713/340; 361/679.46; 361/688

(58) Field of Classification Search .................. 700/300, 700/28, 299; 713/300, 322, 340; 361/687, 361/688, 695, 697
See application file for complete search history.

(56) References Cited

U.S. PATENT DOCUMENTS

| | | | |
|---|---|---|---|
| 5,590,061 A * | 12/1996 | Hollowell et al. ............ 702/130 |
| 6,601,168 B1 | 7/2003 | Stancil et al. |
| 6,745,727 B1 | 6/2004 | Kramer et al. |
| 6,873,883 B2 | 3/2005 | Ziarnik |
| 7,114,658 B2 * | 10/2006 | Lima et al. ..................... 235/492 |
| 7,275,019 B2 * | 9/2007 | Schulke et al. ............... 702/183 |
| 7,409,594 B2 * | 8/2008 | Mukherjee et al. ............. 714/26 |
| 2001/0048289 A1 * | 12/2001 | Sakakibara .................... 320/150 |
| 2002/0138159 A1 * | 9/2002 | Atkinson ......................... 700/21 |
| 2006/0106968 A1 * | 5/2006 | Wooi Teoh .................... 710/316 |
| 2006/0238533 A1 * | 10/2006 | Chen ............................. 345/211 |
| 2007/0005885 A1 * | 1/2007 | Kobayashi et al. ............ 711/114 |
| 2007/0027580 A1 * | 2/2007 | Ligtenberg et al. ............ 700/300 |

OTHER PUBLICATIONS

Haihong Zhuo; Jianwen Yin, Ph.D.; and Anil V. Rao, Remote Management with the Baseboard Management Controller in Eight-Generation Dell PowerEdge Servers, Special Section: New-Generation Server Technology, Oct. 2004, 4 pages, Dell Power Solutions, www/dell.com/powersolutions.

* cited by examiner

*Primary Examiner* — Kakali Chaki
*Assistant Examiner* — Sheela S Rao
(74) *Attorney, Agent, or Firm* — Haynes and Boone, LLP

(57) ABSTRACT

For dynamically cooling an input/output (I/O) controller, the presence of the I/O controller is automatically detected. The I/O controller includes an electronic component capable of generating heat that is greater than a predefined amount when the electronic component is operating in a predefined state. The I/O controller provides a control output in response to a demand indicative of operating the electronic component in the predefined state. The control output is provided to a baseboard management controller (BMC) that is capable of providing additional cooling to the I/O controller in response to the control signal.

17 Claims, 3 Drawing Sheets

METHOD FOR DYNAMICALLY COOLING WHEN DETECTING RAID CONTROLLER WITH BATTERY PRESENT IN COMPUTER SYSTEM

BACKGROUND

The present disclosure relates to heat removal systems, and more particularly to an improved input output (I/O) controller to dynamically remove heat generated by an information handling system ('IHS').

As the value and use of information continues to increase, individuals and businesses seek additional ways to acquire, process and store information. One option available to users is an IHS. The IHS generally processes, compiles, stores, and/or communicates information or data for business, personal, or other purposes thereby allowing users to take advantage of the value of the information. Because technology and information handling needs and requirements vary between different users or applications, IHS may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, entertainment, and/or global communications. In addition, IHSs may include a variety of hardware and software components that may be configured to process, store, and communicate information and may include one or more computer systems, data storage systems, and networking systems.

Most computer systems have built in cooling systems such as fans, blowers, heat sinks and similar others to remove heat generated by the electronic components. The thermal load on the cooling systems may vary depending on a number of factors including number of printed circuit boards or cards, energy consumption per card, ambient temperature and the like. Large computer system applications such as networked storage systems deploying Redundant Array of Independent Disks (RAID) technology and server clusters deploying hundreds of blade servers often house the electronic cards in a compact chassis and several rack mounted chassis may be housed in a cabinet. It is common to use fans/blowers and air conditioning units to remove the heat generated, thereby maintaining the temperature of the cards, the chassis and the cabinets within allowable limits.

Some cards such as a RAID controller may have an on board rechargeable battery. The purpose of the battery is to retain memory through a power loss. Charging and/or discharging of the battery typically utilizes a large amount of current, thereby generating a large amount of heat that may be local to the RAID controller and/or the battery. The localized heat often causes the temperature of the RAID controller card and/or the battery to exceed the allowable limits and potentially create a faulty operating condition.

Presently, many of the fans/blowers may be adjusted to operate under the worst case thermal load. In computer systems that support a large number of cards that may or may not have local heat sources such as the battery, the fans or blowers may be configured to operate at the rated or maximum speed. As a result, the cooling capacity may be greater than necessary and yet may be inadequate to accommodate localized heating. This may result in unnecessary power consumption, may increase acoustical noise level, may reduce the expected service life of the associated fans or blowers, and may potentially result in system downtime due to the failure of components.

Thus, there is an existing need to improve the on-demand removal of heat generated by an IHS; to develop tools and techniques that are adaptable for cooling components of the IHS; and to selectively and dynamically cool components included in an IHS, absent the disadvantages found in the prior techniques discussed above.

SUMMARY

The foregoing need is addressed by the teachings of the present disclosure, which relates to a dynamically cooling selective electronic components of an IHS. According to one embodiment, in a method and system for dynamically cooling an input/output (I/O) controller, a presence of the I/O controller is automatically detected. The I/O controller includes an electronic component capable of generating heat that is greater than a predefined amount when the electronic component is operating in a predefined state. The I/O controller provides a control output in response to a demand indicative of operating the electronic component in the predefined state. The control output is provided to a baseboard management controller (BMC) that is capable of providing additional cooling to the I/O controller in response to the control signal.

In a particular aspect, an I/O controller for cooling includes an electronic component capable of generating heat that is greater than a predefined amount when the electronic component is operating in a predefined state. A timer circuit provides controls for placing the electronic component to operate in the predefined state at a prescheduled time. The I/O controller provides a control output in advance of the prescheduled time by a predefined time interval to request additional cooling in anticipation of the electronic component operating in the predefined state.

Several advantages are achieved according to the illustrative embodiments presented herein. The embodiments advantageously provide an improved technique for dynamically controlling cooling of a selective component of an IHS such as a printed circuit board having a local heat source generating a variable amount of heat. The improved method and system advantageously optimizes power consumption and acoustic/noise level by adaptively balancing on-demand cooling with the anticipated thermal load. Thus, IHS devices equipped with the dynamic cooling technique may generate less noise and may use less power while avoiding damage to electronic components due to excess heat.

DETAILED DESCRIPTION

Figure 1:
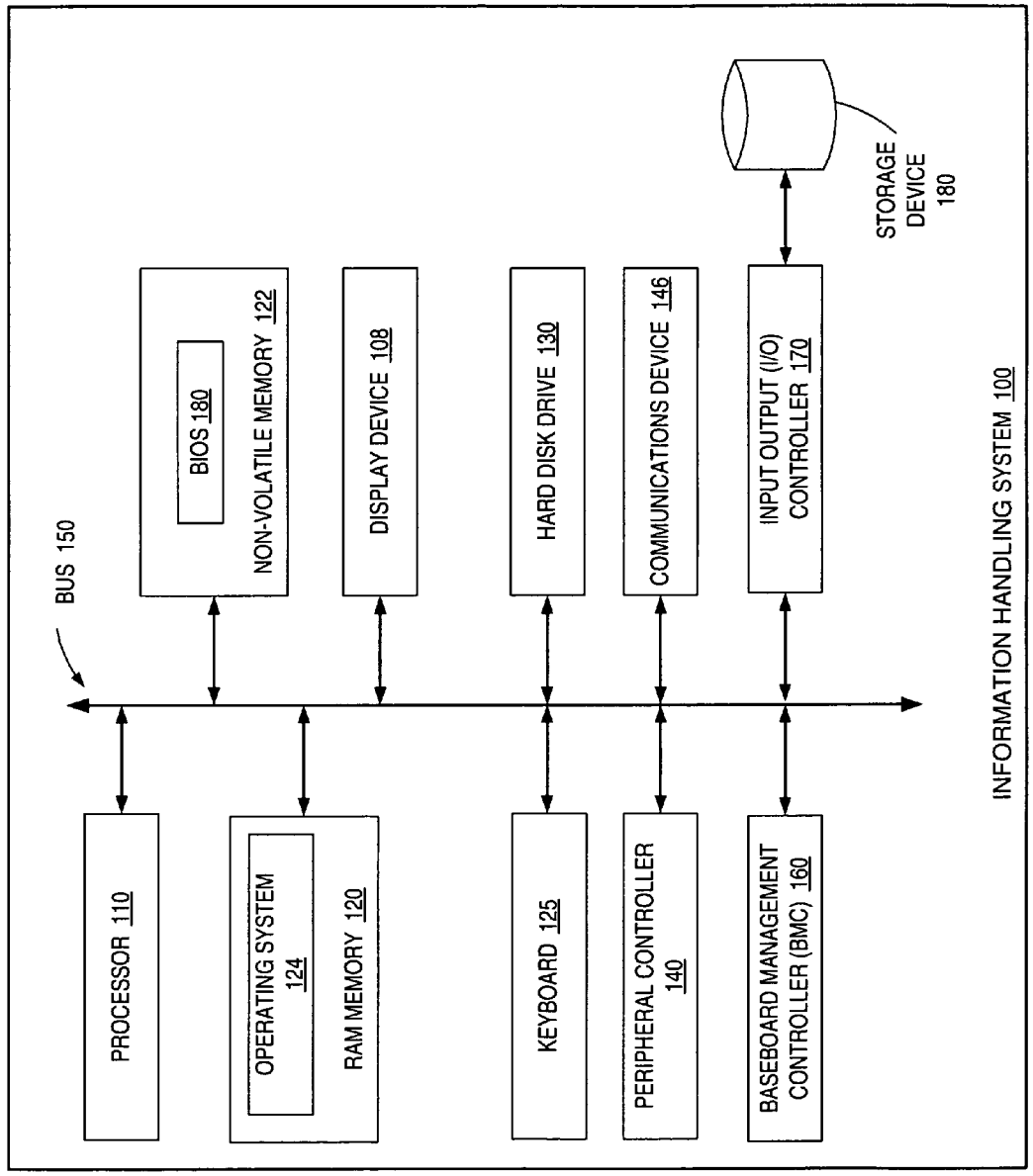
FIG. 1 illustrates a block diagram of an IHS having an improved cooling, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices, boards, cards, modules, blocks, and/or components described herein may be implemented as hardware (including discrete components, integrated circuits and systems-on-a-chip 'SOC'), firmware (including application specific integrated circuits and programmable chips) and/or software or a combination thereof, depending on the application requirements.

As described earlier, fans and/or blowers may be set to operate under worst case thermal loads. As a result, the cooling capacity may be greater than necessary and yet may be inadequate to accommodate localized heating. This may result in unnecessary power consumption, may increase acoustical noise level, may reduce the expected service life of the associated fans or blowers, and may potentially result in system downtime due to the higher probability of failure of components. Thus, a need exists to develop tools and techniques that are adaptable for on-demand removal of heat generated by an IHS. According to one embodiment, in a method and system for dynamically cooling an I/O controller, a presence of the I/O controller is automatically detected. The I/O controller includes an electronic component capable of generating heat that is greater than a predefined amount when the electronic component is operating in a predefined state. The I/O controller provides a control output in response to a demand indicative of operating the electronic component in the predefined state. The control output is provided to a baseboard management controller (BMC) that is capable of providing additional cooling to the I/O controller in response to the control signal.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, the IHS may be a personal computer, including notebook computers, personal digital assistants, cellular phones, gaming consoles, a network storage device, or any other suitable device and may vary in size, shape, performance, functionality, and price. The IHS may include random access memory (RAM), one or more processing resources such as central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses (including parallel and/or serial interconnects) operable to receive/transmit communications between the various hardware components.

FIG. 1 illustrates a block diagram of an IHS 100 having improved cooling, according to an embodiment. The IHS 100 includes a processor 110, a system random access memory (RAM) 120 (also referred to as main memory), a non-volatile memory (NVM) 122 memory, a display device 108, a keyboard 126 and a peripheral controller 140 for controlling various other peripheral devices that communicate via serial links at a low baud rate. For example, the peripheral controller 140 may include a keyboard controller, a cursor device controller and similar others. In an exemplary, non-depicted embodiment, a printed circuit board such as a motherboard may include one or more electronic components such as the processor 110 and the RAM 120 memory. In the depicted embodiment, a baseboard management controller (BMC) 160 monitors and controls the operation of one or more components of the IHS 100 such as the motherboard, fans, blowers, power supplies and similar others. It should be understood that the term "information handling system" is intended to encompass any device having a processor that executes instructions from a memory medium.

The IHS 100 is shown to include a hard disk drive 130 connected to the processor 110, although some embodiments may include additional hard disks, while others may not include the hard disk drive 130. In the depicted embodiment, an input/output (I/O) controller 170 is operable to process a plurality of inputs and outputs (I/O) such as I/O from/to a data storage device 180.

The processor 110 communicates with the system components via a bus 150, which includes data, address and control lines. In one embodiment, the IHS 100 may include multiple instances of the bus 150. In an exemplary, non-depicted embodiment, not all devices shown may be directly coupled to the bus 150. The multiple instances of the bus 150 may be in compliance with one or more proprietary standards and/or one or more industry standards such as peripheral component interconnect (PCI), PCI express (PCIe), industry standard architecture (ISA), universal serial bus (USB), system management bus (SMBus), and similar others. For example, the I/O controller 170 may be coupled to the BMC 160 via the SMbus, in accordance with an intelligent platform management interface (IPMI) standard. A communications device 146, such as a network interface card and/or a radio device, may be connected to the bus 150 to enable wired and/or wireless information exchange between the IHS 100 and other devices (not shown).

In a particular embodiment, a portion of the NVM 122 is used to store a basic input output system (BIOS) 180. In a particular embodiment, the BIOS 180 includes instructions to automatically detect a presence of the I/O controller 170 during power on self test (POST). Additional details of the I/O controller 170 are described with reference to FIG. 2.

The processor 110 is operable to execute the computing instructions and/or operations of the IHS 100. The memory medium, e.g., RAM 120, preferably stores instructions (also known as a "software program") for implementing various embodiments of a method in accordance with the present disclosure. An operating system (OS) 124 of the IHS 100 is a type of software program that controls execution of other software programs, referred to as application software programs. In various embodiments the instructions and/or software programs may be implemented in various ways, including procedure-based techniques, component-based techniques, and/or object-oriented techniques, among others. The BIOS 180 is typically programmed in an assembly language. Software may also be implemented using C, XML, C++ objects, Java and Microsoft's .NET technology.

Figure 2:
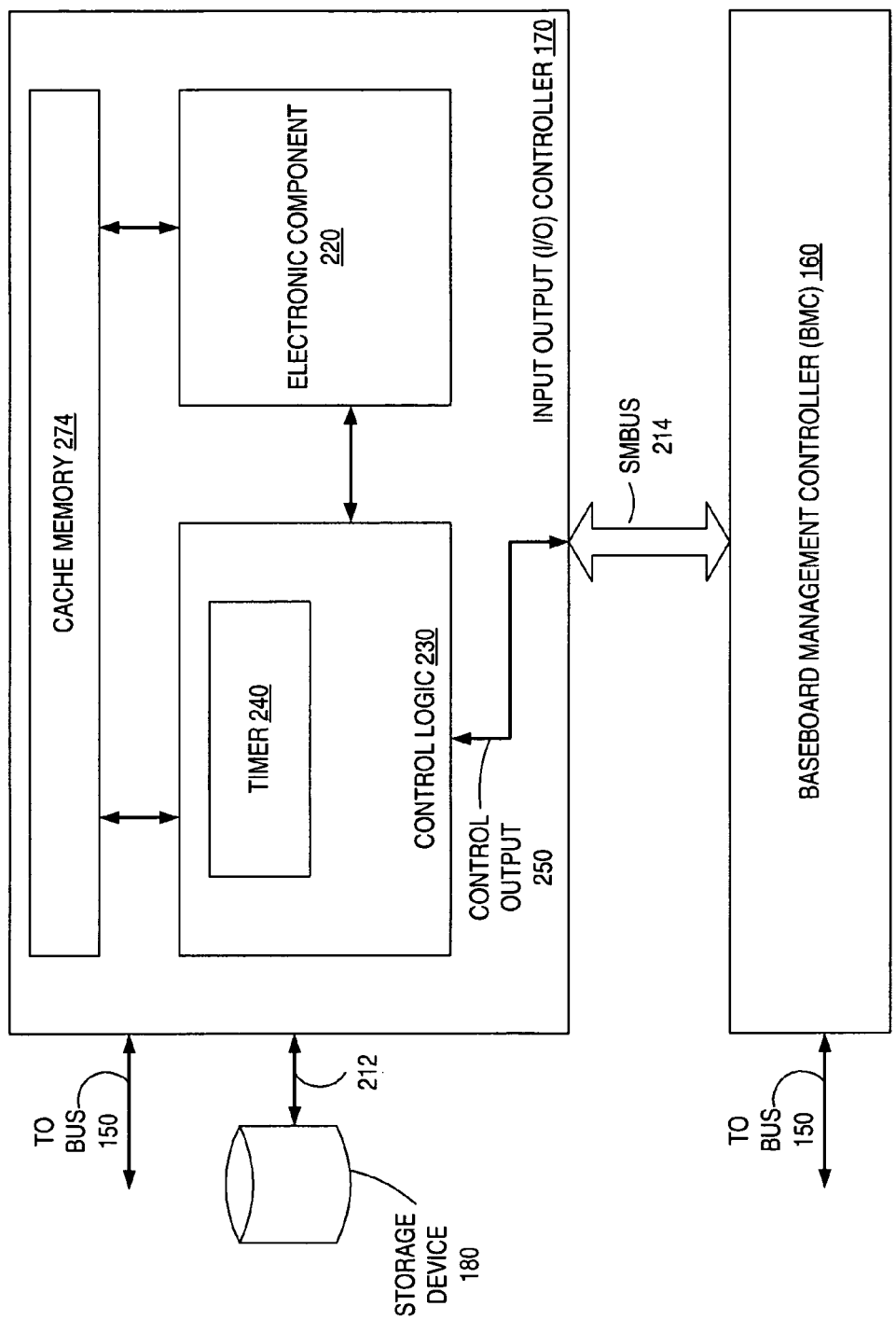
FIG. 2 illustrates a block diagram of an input/output (I/O) controller described with referenced to FIG. 1, according to an embodiment.

FIG. 2 illustrates a closed loop block diagram of an input/output (I/O) controller described with referenced to FIG. 1, according to an embodiment. In the depicted embodiment, the I/O controller 170 is coupled to the data storage device 180 such as RAID disks via an interface 212. In this embodiment, the I/O controller 170 is a RAID controller operable to control one or more RAID disks. The I/O controller 170 is coupled to the BMC 160 via an SMbus 214.

In a particular embodiment, the I/O controller 170 includes an electronic component 220 and a control logic 230. In an exemplary, non-depicted embodiment, the electronic component 220 may be configured to communicate with the control logic 230 via a direct connection and/or via the SMbus 214. The electronic component 220 may include a variety of electronic, electrical, electrochemical and/or electromechanical devices capable of generating heat that is greater than a threshold amount.

In a particular embodiment, the electronic component 220 is a rechargeable battery, which may use technologies such as Lithium Ion (LiON), Nickel Cadmium (NiCd), and Nickel Metal Hydride (NiMH). The purpose of the battery is to retain a cache memory 274 of the I/O controller 170 through a power loss. The battery may be selected to retain the contents of the cache memory 274 through a predefined maximum time period, e.g., 72 hours, of the power loss. A power loss that may exceed the maximum time duration may result in a loss of data stored in the cache memory 274. The battery may be operable in one of various operating states such as trickle charging, rapid charging (or simply charging), discharging, fully charged, critically discharged and the like. To insure availability of the battery when demanded, the battery may be periodically cycled through charging and discharging cycles.

During a charging or discharging cycle, the battery is capable of generating much more excessive heat than in a fully charged or trickle charging state. Thus, the electronic component 220 is capable of generating excessive heat, which may be greater than a predefined amount of heat supported by the IHS 100 system.

The control logic 230 includes a timer 240 operable to control the various operating states of the electronic component 220, including the predefined state. In a particular embodiment, the timer 240 initiates a rapid charging cycle at a prescheduled time. In an exemplary, non-depicted embodiment, the control logic 230 may include a variety of devices such as a processor (other than the processor 110), a digital signal processor, a field programmable gate array (FPGA), a microcontroller, logic gates and similar others operable to execute logic. The control logic 230 provides a control output 250 to the BMC 160 in advance of the prescheduled time by a predefined time interval. The predefined time period may be sufficient to cause the cooling system such as the fans and blowers to rotate at a higher speed to deliver additional airflow. Thus, the control output 250 is provided in anticipation of the increased heat being generated during the rapid charging state of the electronic component 220 and the control output 250 is indicative of a cooling demand desired by the I/O controller 170, including the electronic component 220.

In a particular embodiment, the control output 250 may be provided in response to detecting other events that are different than the timer 240 initiated events and which may be likely to cause the electronic component 220 to generate additional heat. In an embodiment, the electronic component 220 may generate a demand by providing a signal to the control logic 230 indicating a low charge state and the control logic 230 or a charger circuit (not shown) may initiate the rapid charging cycle in response to the low charge state.

In a particular embodiment, the I/O controller 170 may request additional cooling in response to a demand from an on-chip temperature sensor (not shown) that may be embedded in one or more components mounted on the card. For example, the electronic component 220 such as the battery may include a built-in thermal sensor which may be operable to generate the demand for the additional cooling. As another example, the control logic 230 may include integrated circuits having built-in temperature sensors. The built-in temperature sensor may be used to measure temperature of the electronic component 220 and/or of electronics components located in the proximity thereof to generate the demand. The control logic 230 may be configured to provide the control output 250 when the temperature sensor indicates the additional cooling demand. The temperature may increase above the predefined value as a result of a malfunction of a heat removal system component such as a heat sink failure, a fan failure, a failure in the electronic component 220, and similar others.

In an exemplary, non-depicted embodiment, the BMC 160 receives the control output 250 and provides additional cooling by adjusting the fan speed to increase the airflow across the I/O controller 170. In a particular embodiment, if the BMC 160 is not able to provide the additional cooling, e.g., due to power constraints, then a return control signal (shown as a return portion of the control output 250) is sent to the I/O controller 170 to delay the scheduled charging and/or the discharging cycle of the battery and of the electronic component 220. Thus, the I/O controller 170 working co-operatively with the BMC 160 advantageously optimizes power consumption and acoustic/noise level by adaptively balancing on-demand cooling with the anticipated thermal load. It is to be clearly understood that the optimized power consumption and acoustic/noise level reduction may be advantageously achieved without a presence of a built-in temperature sensor.

As described earlier, the BIOS 180 of the IHS 100 is configured to advantageously detect a presence of the I/O controller 170 having the electronic component 220 during POST. The BIOS 180 informs the BMC 160 about the presence of the I/O controller 170 having the electronic component 220. If no electronic component 220 is detected then the BMC 160 is configured to operate the fans without being adjusted for the additional cooling, thereby consuming less power and generating less noise.

Figure 3:
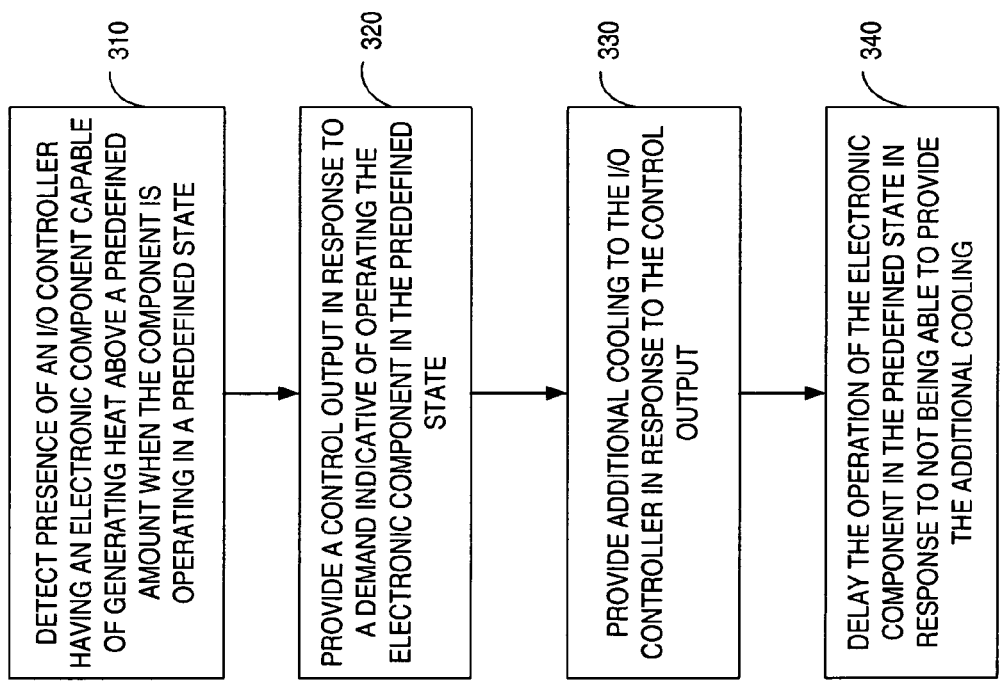
FIG. 3 is a flow chart illustrating a method for cooling an I/O controller, according to an embodiment.

FIG. 3 is a flow chart illustrating a method for cooling an input/output (I/O) controller, according to an embodiment. In a particular embodiment, the I/O controller is the same as the I/O controller 170 described with reference to FIGS. 1 and 2. At step 310, a presence of the I/O controller having an electronic component capable of generating heat that is greater than a predefined amount when the electronic component is operating in a predefined state is detected, e.g., by the BIOS 180 during POST. The BIOS 180 informs the BMC 160 about the presence of the I/O controller 170 having the electronic component 220. At step 320, a control output is provided in response to a demand indicative of operating the electronic component in the predefined state. In a particular embodiment, the demand may be received from the timer 240 in advance of initiating the rapid charging cycle. In yet another embodiment, the demand may be received as a signal from the electronic component 220 indicating a low charge state. At step 330, additional cooling is provided to the I/O controller in response to the control output.

Various steps described above may be added, omitted, combined, altered, or performed in different orders. In a particular embodiment, the steps 320 and 330 may be omitted in response to detecting the I/O controller without the electronic component. In an embodiment, step 320 is omitted and at step 330, additional cooling is provided to the I/O controller in response to detecting the presence of the I/O controller having the electronic component. In this embodiment, the additional cooling is independent of the operating state of the electronic component. As another example, in a particular embodiment, at step 340 if no additional cooling may be provided at step 330 then a response output may be provided to the I/O controller to delay the operation of the electronic component 220 entering the predefined state.

The illustrative embodiments advantageously provide an improved technique for dynamically controlling cooling of a selective component of an IHS such as a printed circuit board having a local heat source generating a variable amount of heat. The improved method and system advantageously optimizes power consumption and acoustic/noise level by adaptively balancing on-demand cooling with the anticipated thermal load. Thus, IHS devices equipped with the dynamic cooling technique may generate less noise and may use less power while avoiding damage to electronic components due to excess heat.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An information handling system (IHS) comprising:
   a processor;
   a bus coupled to the processor;
   an input/output (I/O) controller coupled to the bus, operable to control inputs and outputs, and comprising:
      a heat generating electronic component that is operable to generate heat that is greater than a predefined amount when the heat generating electronic component is operating in a predefined state; and
      a control logic in communication with the heat generating electronic component, the control logic comprising a timer that is operable to initiate the predefined state of the heat generating electronic component at a prescheduled time, wherein the control logic is operable to provide a control output in advance of the prescheduled time in anticipation of the heat generating electronic component generating heat that is greater than the predefined amount when the heat generating electronic component is operating in the predefined state; and
   a baseboard management controller (BMC) coupled to the bus, wherein the BMC is operable to receive the control output from the control logic and, in response, initiate the provision of additional cooling to the heat generating electronic component prior to the prescheduled time in anticipation of the predefined state.

2. The system of claim 1, wherein the inputs and outputs are coupled to a storage device, wherein data stored on the storage device is accessible to the processor.

3. The system of claim 2, wherein the storage device includes hard disk drives in accordance with a redundant array of independent disks (RAID) architecture.

4. The system of claim 1, wherein the I/O controller comprises a RAID controller.

5. The system of claim 1, wherein a basic input output system (BIOS) automatically detects a presence of the I/O controller having the heat generating electronic component when the I/O controller is coupled to the bus.

6. The system of claim 1, wherein the heat generating electronic component is a rechargeable battery.

7. The system of claim 6, wherein the predefined state is one of a charging state and a discharging state.

8. The system of claim 1, wherein the heat producing electronic component enters the predefined state at the prescheduled time, wherein the control output is provided in advance of the prescheduled time by a predefined time interval.

9. The system of claim 1, wherein the control output is communicated via a system management bus (SMbus) in accordance with an intelligent platform management interface (IPMI) standard.

10. The system of claim 1, wherein the BMC is operable to be unable to initiate the provision of the additional cooling and, in response to being unable to initiate the provision of the additional cooling, the BMC is operable to send a return control signal to the I/O controller to delay the initiation of the predefined state.

11. The system of claim 1, wherein the additional cooling results in an increase in air flow across the heat producing electronic component.

12. A method for cooling a heat generating electronic component, the method comprising:
   providing an I/O controller comprising control logic that is in communication with a heat generating electronic component, wherein the control logic comprises a timer that is operable to initiate a predefined state of the heat generating electronic component at a prescheduled time, and wherein the heat generating component is operable to generate heat that is greater than a predefined amount when the heat generating electronic component is operating in the predefined state;
   sending a control output from the control logic to a baseboard management controller (BMC) prior to the prescheduled time in anticipation of the heat generating electronic component generating heat that is greater than the predefined amount when the heat generating electronic component is operating in the predefined state; and
   initiating, by the BMC in response to receiving the control output, the provision of additional cooling to the heat generating electronic component prior to the prescheduled time in anticipation of the predefined state.

13. The method of claim 12 further comprising:
   determining that the BMC is not able to provide additional cooling; and
   sending a return signal to the I/O controller to delay the initiation of the predefined state.

14. The method of claim 13, wherein the predefined state is one of a charging state and a discharging state, and wherein the heat generating electronic component enters the predefined state at the prescheduled time, and wherein the control output is provided in advance of the prescheduled time by a predefined time interval.

15. An input/output (I/O) controller comprising:
   a heat generating electronic component that is operable to generate heat that is greater than a predefined amount when the heat generating electronic component is operating in a predefined state;
   a control logic in communication with the heat generating electronic component and operable to send a control output to a baseboard management controller (BMC) that is coupled to the I/O controller; and
   a timer coupled to the control logic and operable to initiate the predefined state of the heat generating electronic component at a prescheduled time, wherein the control logic is operable to provide the control output to the BMC in advance of the prescheduled time in anticipation of the heat generating electronic component generating heat that is greater than the predefined amount when the heat generating electronic component is operating in the predefined state and, in response to receiving the control output, the BMC being operable to initiate the provision of additional cooling to the heat producing electronic component prior to the prescheduled time in anticipation of the predefined state.

16. The I/O controller of claim 15, wherein the predefined state is one of a charging state and a discharging state, wherein the heat producing electronic component is a rechargeable battery.

17. The I/O controller of claim 15, wherein the BMC is operable to determine that the provision of additional cooling is unavailable and, in response, send a return control signal to the I/O controller to delay the initiation of the predefined state.

* * * * *